(12) United States Patent
Chang et al.

(10) Patent No.: US 8,747,998 B2
(45) Date of Patent: Jun. 10, 2014

(54) COATED ARTICLE AND METHOD FOR MAKING THE SAME

(75) Inventors: Hsin-Pei Chang, New Taipei (TW);
Wen-Rong Chen, New Taipei (TW);
Huann-Wu Chiang, New Taipei (TW);
Cheng-Shi Chen, New Taipei (TW);
Nan Ma, Shenzhen (CN)

(73) Assignees: Hong Fu Jin Precision Industry (ShenZhen) Co., Ltd., Shenzhen (CN);
Hon Hai Precision Industry Co., Ltd., New Taipei (TW)

( * ) Notice: Subject to any disclaimer, the term of this patent is extended or adjusted under 35 U.S.C. 154(b) by 151 days.

(21) Appl. No.: 13/179,788

(22) Filed: Jul. 11, 2011

(65) Prior Publication Data

US 2012/0276370 A1 Nov. 1, 2012

(30) Foreign Application Priority Data

Apr. 28, 2011 (CN) .......................... 201110107938.X

(51) Int. Cl.
*B32B 9/00* (2006.01)

(52) U.S. Cl.
USPC ........... 428/336; 428/469; 428/472; 428/701; 428/702

(58) Field of Classification Search
USPC .......................... 428/336, 469, 472, 701, 702
See application file for complete search history.

(56) References Cited

U.S. PATENT DOCUMENTS 5,790,304 A * 8/1998 Sanders et al. ................. 428/701
8,088,502 B2 * 1/2012 Martin et al. ................... 428/698

* cited by examiner

*Primary Examiner* — Archene Turner
(74) *Attorney, Agent, or Firm* — Novak Druce Connolly Bove + Quigg LLP

(57) ABSTRACT

A coated article is described. The coated article includes an aluminum or aluminum alloy substrate and a compound corrosion resistant layer formed on the substrate. The compound corrosion resistant layer includes a plurality of first non-crystalline films and an equal number of second non-crystalline films. Each the first non-crystalline film interleaves with each the second non-crystalline film. The first non-crystalline film is an aluminum nitride film or an aluminum oxide film. The second non-crystalline film is a silicon nitride film or a silicon dioxide film. A method for making the coated article is also described.

6 Claims, 3 Drawing Sheets

COATED ARTICLE AND METHOD FOR MAKING THE SAME

BACKGROUND

1. Technical Field

The present disclosure relates to coated articles, particularly to a coated article having a corrosion resistance property and a method for making the coated article.

2. Description of Related Art

Aluminum or aluminum alloy is widely used for its excellent properties. To protect the aluminum or aluminum alloy from corrosion, protective layers may be formed on the aluminum or aluminum alloy by anodizing, painting, or vacuum depositing. However, the anodizing and painting processes are not environmentally friendly, and protective layers formed by vacuum depositing may have pinholes and cracks formed therein. These pinholes and cracks allow corrosives to permeate the layers, which causes a galvanic corrosion to the layers and the underlying aluminum or aluminum alloy.

Therefore, there is room for improvement within the art.

BRIEF DESCRIPTION OF THE FIGURES

Many aspects of the disclosure can be better understood with reference to the following figures. The components in the figures are not necessarily drawn to scale, the emphasis instead being placed upon clearly illustrating the principles of the disclosure. Moreover, in the drawings like reference numerals designate corresponding parts throughout the several views.

DETAILED DESCRIPTION

Figure 1:
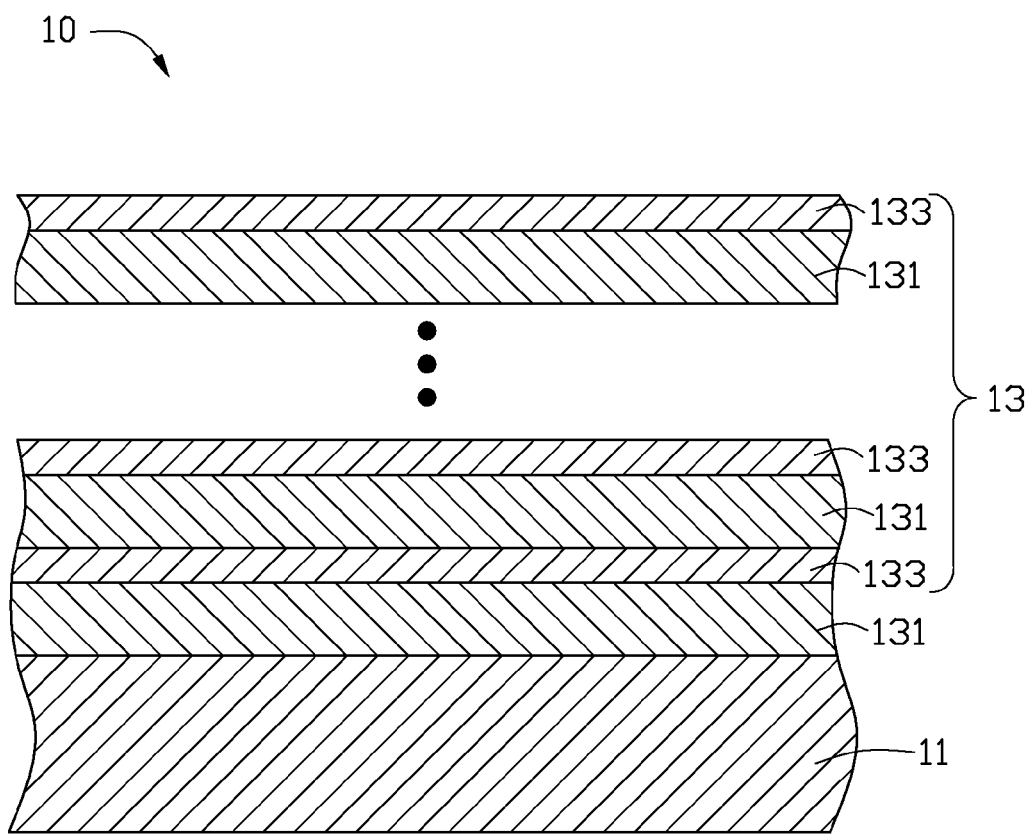
FIG. 1 is a cross-sectional view of an exemplary embodiment of a coated article.
Figure 2:
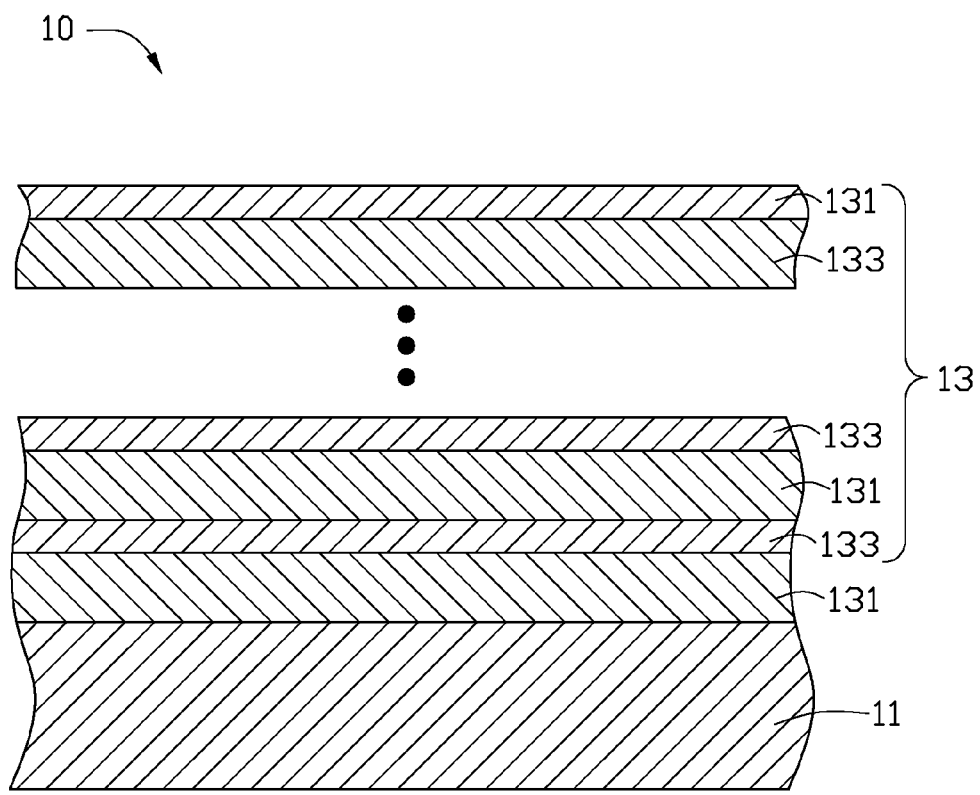
FIG. 2 is another cross-sectional view of an exemplary embodiment of a coated article.

FIG. 1 and FIG. 2 show a coated article 10 according to an exemplary embodiment. The coated article 10 includes an aluminum or aluminum alloy substrate 11, and a compound corrosion resistant layer 13 formed on a surface of the substrate 11.

The compound corrosion resistant layer 13 includes a plurality of first non-crystalline films 131 and an equal number of second non-crystalline films 133. Each first non-crystalline film 131 interleaves with one second non-crystalline film 133. One of the first non-crystalline films 131 or one of the second non-crystalline films 133 is directly formed on the substrate 11. One of the first non-crystalline films 131 or one of the second non-crystalline films 133 forms the external layer of the compound corrosion resistant layer 13. The compound corrosion resistant layer 13 has a thickness of about 500 nm-1000 nm. The total of the first and second non-crystalline films may be of 4 (i.e., 2+2) total layers to about 10 (i.e. 5+5) total layers.

The first non-crystalline film 131 may be an aluminum nitride (AlN) film or an aluminum oxide ($Al_2O_3$) film. In this embodiment, the first non-crystalline film 131 is an AlN film. The first non-crystalline film 131 has a high density because no crystal defects are formed therein, which enables the coated article 10 to have a good corrosion resistance property. The first non-crystalline film 131 is also a hard coating which has a high hardness.

The second non-crystalline film 133 may be a silicon nitride ($Si_3N_4$) film or a silicon dioxide ($SiO_2$) film. In this embodiment, the second non-crystalline film 133 is a $Si_3N_4$ film. The second non-crystalline film 133 has a high density because no crystal defects are formed therein, which further improves the corrosion resistance property of the coated article 10. The second non-crystalline film 133 is also a hard coating, which has a high hardness.

Furthermore, there are a plurality of obvious interfaces formed between each the first non-crystalline film 131 and each the adjacent second non-crystalline film 133. These interfaces increase transverse shifting of the corrosives that may have permeated in the coated article 10 and reduce the permeating rate of the corrosives transiting to the substrate 11, thus reduces the corroding in the coated article 10 and achieves an excellent corrosion resistance property.

The first non-crystalline films 131 and the second non-crystalline films 133 may be all formed by vacuum deposition, such as vacuum sputtering or evaporation deposition.

A method for making the coated article 10 may include the following steps:

The substrate 11 is pre-treated. The pre-treating process may include the following steps:

The substrate 11 is cleaned in an ultrasonic cleaning device (not shown) filled with ethanol or acetone.

Figure 3:
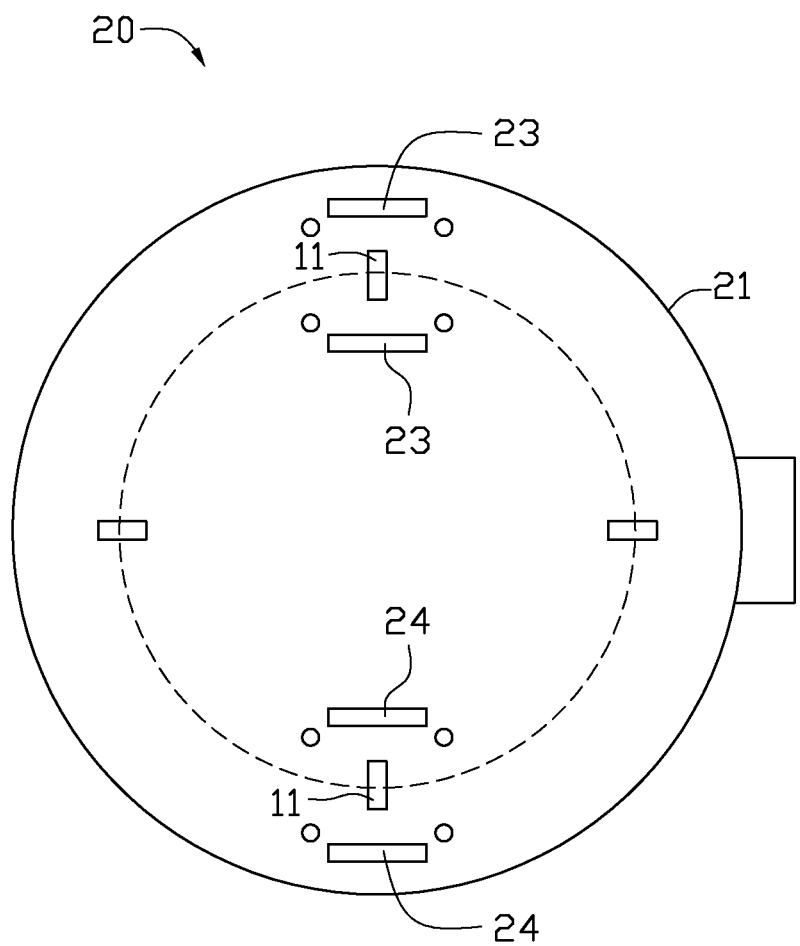
FIG. 3 is an overlook view of an exemplary embodiment of a vacuum sputtering device.

The substrate 11 is plasma cleaned. Referring to FIG. 3, the substrate 11 may be positioned in a coating chamber 21 of a vacuum sputtering device 20. The coating chamber 21 is fixed with aluminum targets 23 and silicon targets 24 therein. The coating chamber 21 is then evacuated to about $8.0 \times 10^{-3}$ Pa. Argon (Ar) gas having a purity of about 99.999% may be used as a working gas and is fed into the coating chamber 21 at a flow rate of about 500 standard-state cubic centimeters per minute (sccm). The substrate 11 may have a negative bias voltage of about −500 V to about −800 V, then high-frequency voltage is produced in the coating chamber 21 and the argon gas is ionized to plasma. The plasma then strikes the surface of the substrate 11 to clean the surface of the substrate 11. Plasma cleaning the substrate 11 may take about 5 minutes (min) to about 10 min. The plasma cleaning process enhances the bond between the substrate 11 and the compound corrosion resistant layer 13. The targets there are unaffected by the pre-cleaning process.

A first non-crystalline film 131 may be magnetron sputtered on the pretreated substrate 11. Magnetron sputtering of the first non-crystalline film 131 is implemented in the coating chamber 21. The internal temperature of the coating chamber 21 may be of about 120° C.-200° C. Nitrogen ($N_2$) or oxygen ($O_2$) may be used as a reaction gas and is fed into the coating chamber 21 at a flow rate of about 100 sccm-200 sccm. Argon gas may be used as a working gas and is fed into the coating chamber 21 at a flow rate of about 100 sccm-200 sccm. A power of about 5 kilowatt (KW)-15 KW is then applied to the aluminum targets 23, and then aluminum atoms are sputtered off from the aluminum targets 23. The aluminum atoms and nitrogen or oxygen atoms are then ionized in an electrical field in the coating chamber 21. The ionized aluminum will chemically react with the ionized nitrogen or oxygen and deposit the first non-crystalline film 131 on the substrate 11. During the depositing process, the substrate 11 may have a negative bias voltage of about −100 V to about −300 V. Depositing of the first non-crystalline film 131 may take about 10 min-30 min.

A second non-crystalline film 133 may be magnetron sputtered on the first non-crystalline film 131. Magnetron sputtering of the second non-crystalline film 133 is implemented in the coating chamber 21. The internal temperature of the coating chamber 21 may be about 120° C.-200° C. Nitrogen (N$_2$) or oxygen (O$_2$) may be used as a reaction gas and is fed into the coating chamber 21 at a flow rate of about 100 sccm-250 sccm. Argon gas may be used as a working gas and is fed into the coating chamber 21 at a flow rate of about 100 sccm-200 sccm. A power of about 8 KW-20 KW is then applied to the silicon targets 24, and then silicon atoms are sputtered off from the silicon targets 24. The silicon atoms and nitrogen or oxygen atoms are then ionized in an electrical field in the coating chamber 21. The ionized silicon will chemically react with the ionized nitrogen or oxygen and deposit the second non-crystalline film 133 on the first non-crystalline film 131. During the depositing process, the substrate 11 may have a negative bias voltage of about −100 V to about −300 V. Depositing of the second non-crystalline film 133 may take about 10 min-30 min.

The steps of magnetron sputtering the first non-crystalline film 131 and the second non-crystalline film 133 are alternately repeated to form the compound corrosion resistant layer 13.

It is to be understood that the order of magnetron sputtering the first non-crystalline film 131 and the second non-crystalline film 133 can be interchanged with each other.

Specific examples of making the coated article 10 are described below. The ultrasonic cleaning in these specific examples may be substantially the same as described above so it is not described here again. Additionally, the process of magnetron sputtering the compound corrosion resistant layer 13 in the specific examples is substantially the same as described above, and the specific examples mainly emphasize the different process parameters of making the coated article 10.

Example 1

Plasma cleaning the substrate 11: the flow rate of Ar is 500 sccm; the substrate 11 has a negative bias voltage of −500 V; plasma cleaning of the substrate 11 takes 8 min.

Sputtering to form a first non-crystalline film 131: the flow rate of Ar is 150 sccm, the flow rate of N$_2$ is 150 sccm; the substrate 11 has a negative bias voltage of −150 V; the aluminum targets 23 are applied with a power of 8 KW; the internal temperature of the coating chamber 21 is 150° C.; sputtering of the first non-crystalline film 131 takes 12 min; the first non-crystalline film 131 has a thickness of 50 nm.

Sputtering to form a second non-crystalline film 133: the flow rate of Ar is 180 sccm, the flow rate of N$_2$ is 180 sccm; the substrate 11 has a negative bias voltage of −150 V; the silicon targets 24 are applied with a power of 10 KW; the internal temperature of the coating chamber 21 is 150° C.; sputtering of the second non-crystalline film 133 takes 18 min; the second non-crystalline film 133 has a thickness of 80 nm.

Repeating the steps of forming the first non-crystalline film 131 and the second non-crystalline film 133 alternately.

The total of the first and the second non-crystalline films is of 6 layers (i.e. 3+3).

Example 2

Plasma cleaning the substrate 11: the flow rate of Ar is 500 sccm; the substrate 11 has a negative bias voltage of −600 V; plasma cleaning of the substrate 11 takes 5 min.

Sputtering to form a first non-crystalline film 131: the flow rate of Ar is 180 sccm, the flow rate of N$_2$ is 180 sccm; the substrate 11 has a negative bias voltage of −200 V; the aluminum targets 23 are applied with a power of 12 KW; the internal temperature of the coating chamber 21 is 200° C.; sputtering of the first non-crystalline film 131 takes 24 min; the first non-crystalline film 131 has a thickness of 100 nm.

Sputtering to form a second non-crystalline film 133: the flow rate of Ar is 220 sccm, the flow rate of N$_2$ is 180 sccm; the substrate 11 has a negative bias voltage of −200 V; the silicon targets 24 are applied with a power of 18 KW; the internal temperature of the coating chamber 21 is 200° C.; sputtering of the second non-crystalline film 133 takes 24 min; the second non-crystalline film 133 has a thickness of 100 nm.

Repeating the steps of forming the first non-crystalline film 131 and the second non-crystalline film 133 alternately.

The total of the first and the second non-crystalline films is of 4 layers (i.e. 2+2).

A salt spray test has been performed on the coated articles 10 described in the above examples 1-2. The salt spray test uses a sodium chloride (NaCl) solution having a mass concentration of 5% at a temperature of 35° C. The test indicates that the corrosion resistance property of the coated article 10 lasts longer than 72 hours. Thus, the coated article 10 has a good corrosion resistance property.

It is believed that the exemplary embodiment and its advantages will be understood from the foregoing description, and it will be apparent that various changes may be made thereto without departing from the spirit and scope of the disclosure or sacrificing all of its advantages, the examples hereinbefore described merely being preferred or exemplary embodiment of the disclosure.

What is claimed is:

1. A coated article, comprising:
   an aluminum or aluminum alloy substrate; and
   a compound corrosion resistant layer formed on the substrate, the compound corrosion resistant layer comprising a plurality of first non-crystalline films and an equal number of second non-crystalline films, each the first non-crystalline film interleaving with one second non-crystalline film; the first non-crystalline film being an aluminum nitride film, the second non-crystalline film being a silicon nitride film.

2. The coated article as claimed in claim 1, wherein one of the first non-crystalline films or one of the second non-crystalline films is formed on the substrate, one of the first non-crystalline films or one of the second non-crystalline films forms the external layer of the compound corrosion resistant layer.

3. The coated article as claimed in claim 1, wherein the compound corrosion resistant layer has a thickness of about 500 nm-1000 nm.

4. The coated article as claimed in claim 1, wherein combined number of first and second non-crystalline films is about 4 layers to about 10 layers.

5. The coated article as claimed in claim 1, wherein the first and the second non-crystalline films are formed by vacuum deposition.

6. A coated article, comprising:
   an aluminum or aluminum alloy substrate; and
   a compound corrosion resistant layer formed on the substrate, the compound corrosion resistant layer comprising a plurality of first non-crystalline films and an equal number of second non-crystalline films, each the first non-crystalline film alternately stacking to one second non-crystalline film; the first non-crystalline film being an aluminum nitride film, the second non-crystalline film being a silicon nitride film.

* * * * *